(12) United States Patent
Bower et al.

(10) Patent No.: US 6,475,931 B2
(45) Date of Patent: Nov. 5, 2002

(54) METHOD FOR PRODUCING DEVICES HAVING PIEZOELECTRIC FILMS

(75) Inventors: John Eric Bower, Somerset; John Z. Pastalan, Hampton; George E. Rittenhouse, Holmdel, all of NJ (US)

(73) Assignee: Agere Systems Inc., Orlando, FL (US)

( * ) Notice: Subject to any disclaimer, the term of this patent is extended or adjusted under 35 U.S.C. 154(b) by 0 days.

(21) Appl. No.: 09/861,839

(22) Filed: May 21, 2001

(65) Prior Publication Data

US 2001/0026981 A1 Oct. 4, 2001

Related U.S. Application Data

(62) Division of application No. 09/502,868, filed on Feb. 11, 2000, now Pat. No. 6,329,305.

(51) Int. Cl.$^7$ .............................................. H01L 21/00
(52) U.S. Cl. ...................................... 438/800; 438/964
(58) Field of Search .......................... 438/800, 71, 260, 438/458, 489, 526, 728, 964

(56) References Cited

U.S. PATENT DOCUMENTS

| | | | | |
|---|---|---|---|---|
| 5,903,087 A | * | 5/1999 | Mattson et al. | 310/365 |
| 5,936,150 A | * | 8/1999 | Kobrin et al. | 73/24.06 |
| 6,329,305 B1 | * | 12/2001 | Bower et al. | 438/800 |
| 6,342,134 B1 | * | 1/2002 | Barber | 204/192.18 |

* cited by examiner

Primary Examiner—David Nelms
Assistant Examiner—David Nhu
(74) Attorney, Agent, or Firm—Lowenstein Sandler PC

(57) ABSTRACT

A method for achieving improved piezoelectric films for use in a resonator device is disclosed. The method is based on applicant's recognition that the texture of a piezoelectric film (e.g., as used in a piezoelectric resonator) is directly affected by the surface morphology of the underlying electrode, and additionally, the surface morphology of the electrode is affected by the surface morphology of the underlying oxide layer or Bragg stack. Accordingly, the invention includes a method of making a device having a piezoelectric film and electrode including controlling the deposition and surface roughness of the electrode and optionally, the Bragg stack.

4 Claims, 3 Drawing Sheets

METHOD FOR PRODUCING DEVICES HAVING PIEZOELECTRIC FILMS

CROSS REFERENCE TO RELATED APPLICATIONS

This application is a divisional of U.S. patent application Ser. No. 09/502,868, filed by John E. Bower et al. on Feb. 11, 2000 now Pat. No. 6,329,305 and entitled "Method For Producing Devices Having Piezoelectric Films", which is incorporated herein by reference.

RELATED APPLICATIONS

This application is related to U.S. patent application Ser. No. 09/503,225, titled "Method for Producing Piezoelectric Films with Rotating Magnetron Sputtering Process," filed concomitantly herewith by inventors Barber and Miller and assigned to the present assignee (hereinafter the "Barber application"), which is incorporated herein by reference.

FIELD OF THE INVENTION

The invention relates to a method for producing electronic devices containing a piezoelectric film on a metal electrode. The invention is particularly usefull in fabricating acoustic resonators and semiconductor devices.

BACKGROUND OF THE INVENTION

Communications systems typically include a variety of devices (e.g., filters, mixers, amplifiers, integrated circuits, and so forth). Communications systems are useful for transmitting information (e.g., voice, video, data) relayed by means of wireless links, twisted pair, optical fibers, and so forth. As wireless communications systems become more advanced, signals are being transmitted at higher frequencies (e.g., PCS, ISM, etc). As systems are continually developed in response to market pressures, the demand for increased performance and reduced size intensifies. Market forces demand increased integration and reduction of component size.

Resonators such as Bulk Acoustic Wave (BAW) resonators are important components in the fabrication of bandpass filters and other related semiconductor devices. The BAW resonator is a piezoelectric resonator that essentially comprises a film of piezoelectric material (e.g., a crystalline AlN film), deposited between at least two electrodes. Upon application of voltage to such a structure, the piezoelectric material will vibrate in an allowed vibrational mode at a certain frequency. Piezoelectric resonators are thus useful in discriminating between signals based on frequency diversity (e.g., a bandpass filter), and in providing stable frequency signals (e.g., as in a frequency stabilizing feedback element in an oscillator circuit).

Typically, the performance of the resonant frequency of the piezoelectric resonator will depend upon the composition, thickness, and orientation of the piezoelectric material. The resonant frequency of a piezoelectric material is typically inversely proportional to its thickness; thus, for piezoelectric resonators to operate at high frequencies {e.g., frequencies greater than ~700 Megahertz (MHz)}, the thickness of the piezoelectric film must be reduced to a thin film (e.g., having a thickness ranging from about 500 nm to about 10 $\mu$m). The performance of a piezoelectric resonator is dependent on the crystalline orientation of the atoms comprising the piezoelectric film. The induced strain (i.e., stress wave) in a piezoelectric film in response to applied voltage (i.e., electric field) can only occur from the advantageous alignment of the atomic dipoles within the piezoelectric film. An example of an advantageous film orientation is <002> of AlN perpendicular to the substrate. A pulse DC sputtering method for depositing thin films of piezoelectric materials such as aluminum nitride (AlN) is described in U.S. patent application Ser. No. 09/145,323, to Miller et al., "Pulse DC Reactive Sputtering Method for Fabricating Piezoelectric Resonators," filed Sep. 1, 1998, assigned to the present assignee and incorporated herein by reference. In Miller et al., the quality of the piezoelectric films is improved with the techniques used to deposit the films themselves.

As may be appreciated, those in the field of communications systems and components continue to search for new methods for increasing system performance and integration. In particular, it would be advantageous to provide new methods for improving the quality of piezoelectric films. These and further advantages of this invention may appear more fully upon considering the detailed description given below.

SUMMARY OF THE INVENTION

Summarily described, the invention embraces a method for achieving improved piezoelectric films for use in electronic devices, particularly resonators. The method is based on applicant's recognition that the texture of a piezoelectric film (e.g. as used in a piezoelectric resonator) is directly affected by the surface morphology of the underlying metal layer (e.g., electrode). Accordingly, the invention comprises a method of making a device having a piezoelectric film and electrode comprising controlling the deposition and surface roughness of the metal layer, ie., a lower surface roughness for the electrode results in an improved quality for the piezoelectric film. A low surface roughness may be achieved by depositing the metal layer such that it has a full width, half maximum (FWHM) rocking curve of less than about 4.5°, which produces a piezoelectric layer deposited thereon having a FWHM rocking curve of less than about 3.5°.

BRIEF DESCRIPTION OF THE DRAWINGS

For a better understanding of the invention, an exemplary embodiment is described below, considered together with the accompanying drawings, in which.

Figure 2:
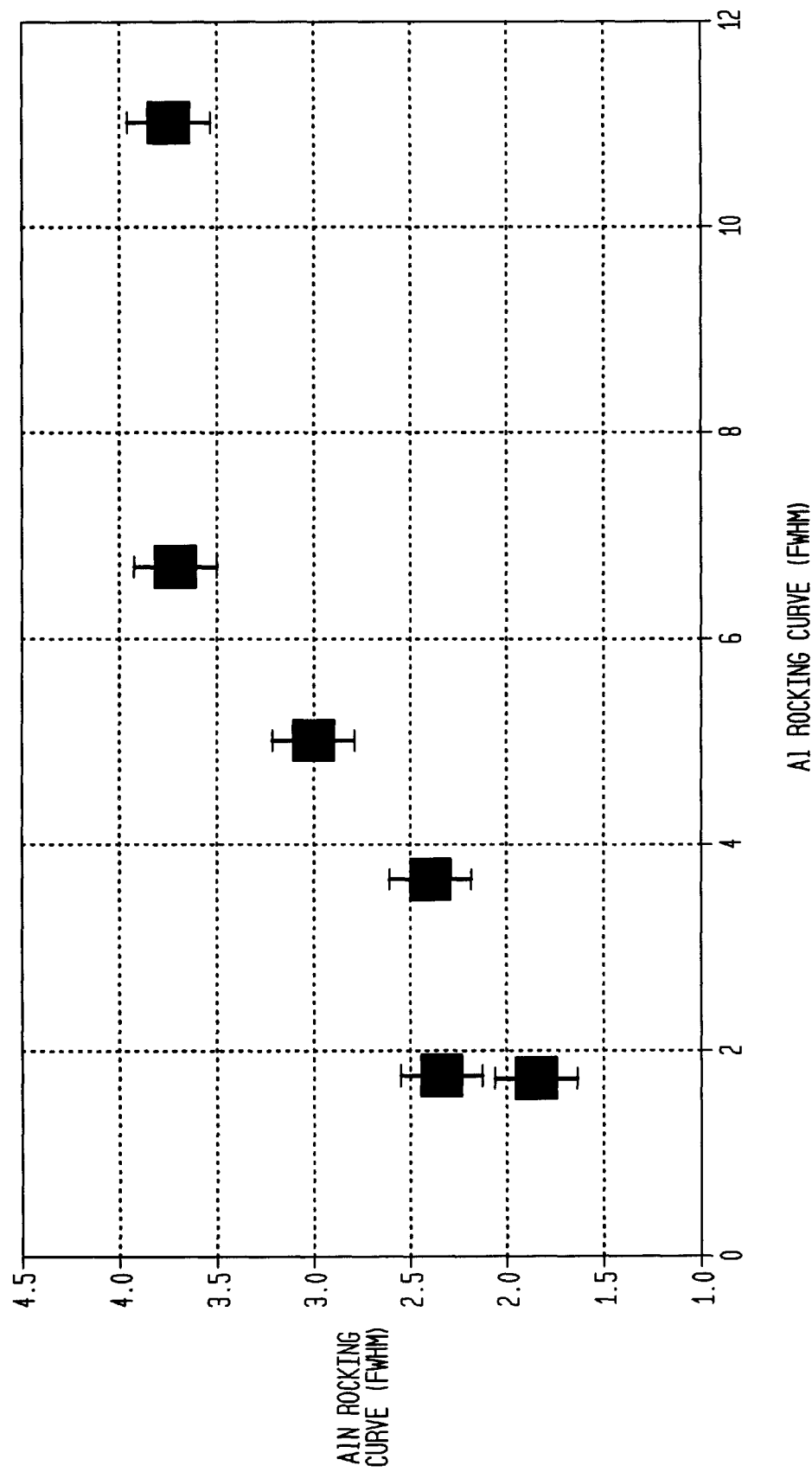
FIG. 2 is a graph plotting the rocking curves of AlN piezoelectric films as a function of rocking curves of Al bottom electrode, showing the effect of Al texture on AlN texture.

It is to be understood that these drawings are for the purposes of illustrating the concepts of the invention and except for the graph of FIG. 2 are not to scale.

DETAILED DESCRIPTION OF THE INVENTION

Although specific features and configurations are discussed below, it should be understood that these examples are for purposes of illustration only. One skilled in the relevant art will recognize that other steps, configurations and arrangements may be used without departing from the spirit and scope of the invention.

Figure 1:
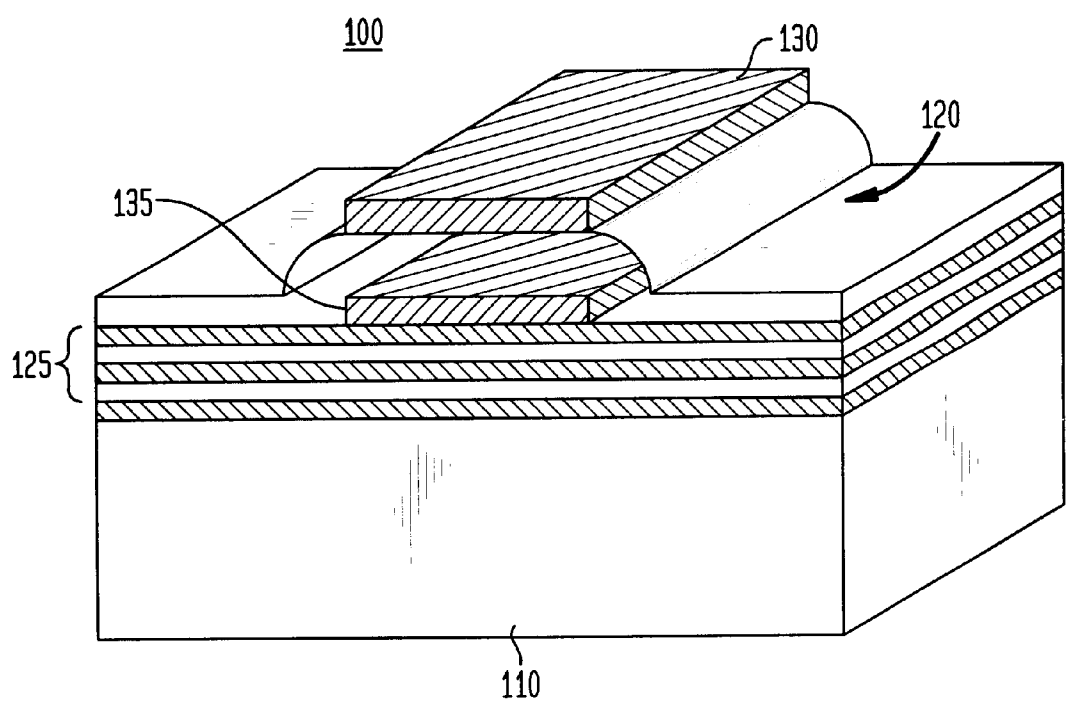
FIG. 1 is a perspective schematic illustration of an acoustic resonator.

FIG. 1 is a perspective schematic illustration of an acoustic resonator, which may be fabricated using the inventive method. The resonator 100 comprises a substrate 110, a layer 120 of piezoelectric material, and an acoustic reflecting region 125, such as a Bragg reflecting region, between the substrate 110 and layer 120. Alternative to the reflecting region 125, a layer of air (not shown) may be used to suspend the layer 120 above the substrate 110. A bottom electrode 135 and top electrode 130 are disposed on opposite surfaces of the piezoelectric layer 120.

The layer of piezoelectric material advantageously comprises AlN, but may be made of any suitable material that has piezoelectric qualities sufficient for the particular resonator application. Typical piezoelectric materials include, for example, quartz, zinc oxide (ZnO), and ceramic materials such as lithium niobate ($LiNbO_3$), lithium tantalate ($LiTaO_3$), paratellurite ($TeO_2$), and lead titanate zirconate (PZT-SA). The substrate typically is comprised of silicon but may be fabricated with other materials such as quartz, sapphire, polysilicon, aerogel, and aluminum oxide ($Al_2O_3$).

The invention pertains to a method for obtaining improved piezoelectric films. Applicants have discovered that the operation of a resonator device, and in particular, the piezoelectric film, can be improved by manipulating the morphology of the electrode surface on which the piezoelectric film is deposited. Applicants further have discovered that the growth of the piezoelectric film (e.g., AlN) is not epitaxial (i.e., the AlN layer is not grown with lattice matching or coordination with the electrode material), and the morphology of the electrode surface affects the c-axis orientation and rocking curve of the piezoelectric film.

The term "texture" as used herein is intended to describe the crystallographic alignment of grains in a polycrystalline film wherein "maximum texture" denotes a film having an alignment (orientation) of grains centered about a single direction at an angle subtended from (relative to) the growth direction. The texture and thus quality of the piezoelectric layer can be defined by reference to its "rocking curve." More specifically, ideally the grains are centered about a single direction; as mentioned above, the performance of the piezoelectric film (e.g. in a piezoelectric resonator), is dependent upon the crystalline orientation of the atoms comprising the film. Typically, however, there will be a gaussian distribution of directions about which the grains are centered. The smaller the distribution, the closer the film is to maximum texture. The distribution of grain directions may be plotted to define a peak, and the width of the peak at half its maximum height (full-width at half maximum) (FWHM, i.e., the "rocking curve", reflects a value for defining the quality of the film texture. The "rocking curve" number is thus the figure of merit for the film texture, i.e., the smaller the distribution, the smaller the rocking curve, and the closer the film is to maximum texture. The piezoelectric layer advantageously is formed with FWHM rocking curves of less than 11°, with a more preferred low rocking curve being less than about 3.5°, and more preferably less than 2.5° (FWHM).

The invention is based on applicant's recognition that the electrode composition and deposition may be manipulated to approach a maximum texture for the piezoelectric films and achieve optimal operation of the resonator. In contrast, previous methods for improving piezoelectric film texture and performance have focussed on the composition and different methods of depositing the piezoelectric films themselves. According to the invention, the electrode is prepared (e.g., through deposition processing, polishing, or material selection) so that it has a low surface roughness which results in a piezoelectric film having a low rocking curve and improved quality. Advantageously, the electrode has a surface roughness of less than about 0.1–100 Å, or more preferably, of less than 15 Å RMS. Applicants have discovered that the surface roughness of the electrode can be reduced by minimizing its FWHM rocking curve; a low rocking curve for the electrode results in a low surface roughness for the electrode surface. Additionally, the surface roughness of the electrode can be addressed by the underlying insulating or Bragg stack layers; e.g., the lower the RMS value of the oxide layer of the Bragg stack, the lower the rocking curve of the electrode, as well as the RMS value of the electrode surface. A polished (e.g., CMP) oxide Bragg stack yields a better surface roughness for the metal electrode than the as-deposited oxide Bragg stack. Applicants have also discovered that the surface roughness of the electrode layer may be improved by selection of the metals comprising the electrode stack.

Advantageously, with the invention, the electrodes and particularly the bottom electrode 135 may comprise aluminum (Al) or a metal stack using collimated (physical flux selector) titanium followed by Al (c-Ti/Al). Previous stacked metal electrodes often have comprised c-Ti/TiN/Al as the composition of choice. Applicants have surprisingly discovered that the surface roughness of the Al surface on which the piezoelectric layer is deposited may be improved by at least a factor of two by eliminating the TiN layer from the metal stack. Additionally, besides use of Al and/or c-Ti/Al, any other metal having a sufficiently low sheet resistance and low surface roughness may be used for fabricating the electrodes 130, 135. A metal having a sheet resistance in the range of 0.01 to 100 ohms per square ($\Omega/\square$) should be sufficiently low, but more preferably the sheet resistance is approximately 1 $\Omega/\square$. A metal having a surface roughness in the range 0.1 to 100 Å (Angstroms) should be sufficiently low, but more preferably the surface roughness is approximately less than 15 Å.

FIG. 2 is a plot of the AlN rocking curve as a function of the Al rocking curve, e.g., for a resonator where the bottom electrode 135 comprises collimated titanium and Al (c-Ti/Al) and the piezoelectric layer 120 comprises AlN. As can be seen, there is a direct, although non-linear, effect of the Al texture (electrode 135) on the AlN texture (piezoelectric 120). The Al texture thus affects the coupling constant (pole/zero separation) for the resonator. Thus, the electrodes (e.g., Al and c-Ti layers) may be formed with a texture such that they have the smallest full-width at half maximum (FWHM) rocking curves. For the collimated Ti layer, a useful texture for a resonator application is achieved when the FWHM is in range of about 0.2° to 9°, and a typical, preferred rocking curve is where the FWHM is about less than 4.5°. For the Al layers, a useful texture for this application is achieved when the FWHM is in range of about 0.2° to 11°, with a typical, preferred rocking curve being about less than 40° (FWHM). The regions of piezoelectric material advantageously are formed with FWHM rocking curves within the range of about 0.2° to 11°, with a typical, preferred low rocking curve being less than about 2.5° (FWHM). The low rocking curve of the electrode results in a low surface roughness for the electrode, which applicants have discovered improves the quality of the piezoelectric layer.

With this invention, a low root mean square (RMS) morphology can be achieved for the electrode without having to perform polishing, i.e., chemical mechanical polishing (CMP), of this layer 120 after it is deposited. The RMS value reflects a true average, absolute value for the deviation or difference in the surface morphology from a mean value of zero, the value of zero reflecting a completely smooth surface. The RMS value is defined by the square root of the difference between the mean square and the square of the mean, or in other words, it is the normalized average value of the roughness relative to the median of the measured roughness. Advantageously, a crystallographic metal (e.g., c-Ti and Al) is deposited for the electrode with a single orientation and maximum texture. For example, the Al electrode can have a <111> orientation parallel to the substrate normal. The c-titanium deposition, when used, preferably produces a film of a single orientation <002>. Since the method of achieving a good texture for the piezoelectric layer according to this invention does not depend upon lattice matching, a sufficiently low rocking curve for the piezoelectric layer (AlN) may be obtained on various surfaces of sufficiently low surface roughness, e.g., substrates with terminated surfaces of silicon, CMP oxide, c-titanium/aluminum, or other suitable materials. Although the lattice parameters of silicon <100> and aluminum <111> are mismatched to AlN, one can obtain a low rocking curve with AlN on Si or a low rocking curve for AlN on Al. The invention is thus advantageous for not only improving the quality of the piezoelectric layers but increasing the flexibility in selecting the materials used for fabricating the resonator or other devices including the piezoelectric films.

Applicants have further discovered that the resultant surface roughness of the electrode (e.g. FIG. 1, 135), is affected by the surface morphology of its underlying layer, e.g., the acoustic reflecting layers 125. For example, when a standard oxide deposited by physical vapor deposition is used, a resulting Al texture of 11 degrees (FWHM) may result. However, applying the same conditions for depositing the Al layer, the resultant texture of the Al layer is 4 degrees (FWHM) when a CMP oxide is used. The CMP oxide is automatically substantially smooth (e.g., having a RMS surface roughness of less than 3 Å), while a standard PVD oxide of the last layer of a Bragg stack has a surface roughness of about 45 to 60 Å RMS. The lower the RMS value of the oxide layer of the Bragg stack, the lower the rocking curve of the electrode, as well as the RMS value of the electrode surface. A polished (e.g., CMP) oxide Bragg stack yields a better texture for the metal electrode than the as-deposited oxide Bragg stack.

Figure 3:
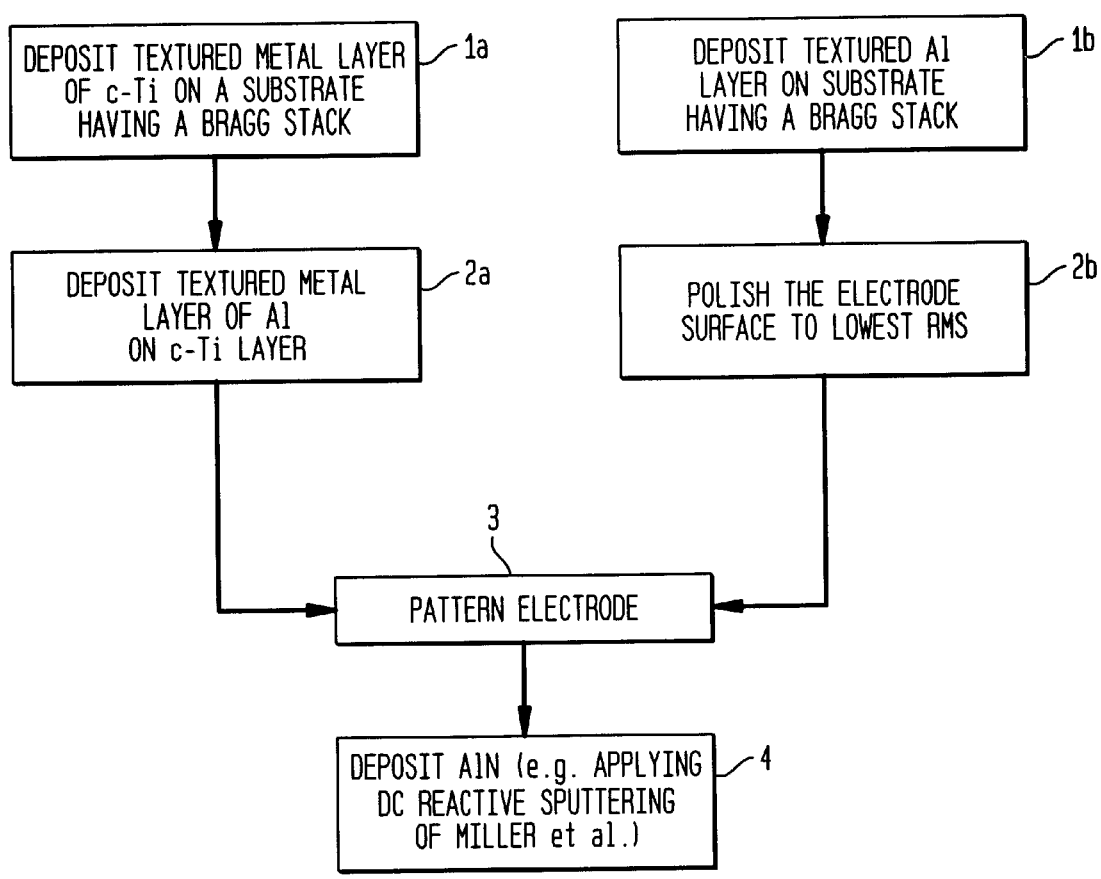
FIG. 3 is a block diagram showing steps for performing the inventive method.

FIG. 3 is a block diagram of exemplary steps for performing the inventive method of achieving a resonator structure having improved piezoelectric films. Blocks 1a, 2a, 3 and 4 reflect one embodiment of the method, and blocks 1b, 2b, 3 and 4 an alternative embodiment. According to one embodiment, a first step (block 1a) comprises depositing a textured metal layer of c-titanium on a substrate, e.g., typically a silicon substrate, having acoustic reflecting layers thereon such as a Bragg stack. Preferably, at least the last layer of the Bragg stack is polished to achieve the best results for the metal electrode texture. As described above, applicants have discovered that the texture of the electrode and thus, the piezoelectric layer, may be affected by the quality of the last layer of the Bragg stack. The co-pending Barber application, previously cited and incorporated herein, describes an advantageous method for depositing Bragg stack layers (e.g., comprising $SiO_2$ films) and optimizing the deposition process.

The collimated-titanium deposition advantageously results in a film of a single orientation <002> and a texture having a rocking curve of less than 4.5 degrees FWHM. The c-Ti layer may have a thickness in the range of about 100 to 1000 Å, and more preferably a thickness of about 300 Å. Deposition techniques known in the field may be used to deposit this layer, although an advantageous process comprises sputter deposition at a temperature of about 250° C. and deposition rate within the range of about 8–12 Å/sec, more preferably at the rate of about 10 Å/sec.

A second step of this exemplary method (block 2a) comprises depositing Al on the c-Ti layer, without a vacuum break and at a sufficiently high rate and substrate temperature so that the resultant Al texture has a FWHM of less than 4.5°. The Al layer may comprise other alloying elements, such as Cu, preferably at small percentages. For example, a layer of Al –0.5%Cu is suitable. Deposition parameters may be selected based on knowledge of one skilled in the field. Suitable parameters include a deposition temperature of 200° C. and rate of about 100 Å/sec to produce an Al layer having a thickness in the range of about 200 Å to 2500 Å with a nominal thickness of about 1200 Å. No post processing or re-deposition of the Al surface is necessary to achieve the textured growth of the AlN.

Once the stacked metal electrode is deposited, a third step (block 3) comprises patterning the metal electrode. Standard photolithographic processes may be used to pattern the electrode. Applying a fourth step (block 4), the piezoelectric layer 120, which advantageously comprises AlN, is deposited on the patterned electrode. The piezoelectric layer 120 advantageously is sputter deposited on the bottom electrode 135, applying the DC reactive sputtering process of Miller et al., cited above. However, other deposition techniques may be used as well. For example, the co-pending Barber application, incorporated herein, describes steps for optimizing the process of depositing piezoelectric films using rotating magnet magnetrons and pulsed DC power supplies.

An alternative method for preparing an inventive resonator device is shown in blocks 1b, 2b, 3 and 4 of FIG. 3. In this embodiment, the electrode comprises a single electrode material, rather than the stacked electrode of the previous embodiment. A first step (block 1b) comprises depositing the metal electrode material, e.g., of Al or any other metal having a low surface resistance, on the substrate containing the Bragg stack or other acoustic membrane support layer (e.g., $SiN_x$). Deposition parameters known in the field and described above may be applied to deposit this layer. A second step (block 2b) comprises polishing the surface of the electrode layer to the lowest root mean square figure. This figure preferably will in the range of about 3–10 Å, and more preferably will be less than about 7.5 Å. As in the previous embodiment, the electrode material is patterned (block 3), and the AIN layer is deposited on the patterned metal electrode surface (block 4) to result in a maximum textured AIN film. Other depositional process parameters can be optimized as described in Miller et al., cited above.

It is understood that the embodiments described herein are merely exemplary and that a person skilled in the art may make variations and modifications without departing from the spirit and scope of the invention. All such variations and modifications are intended to be included within the scope of the appended claims.

We claim:

1. A method for fabricating a resonator device having a piezoelectric material deposited on at least one metal layer, the method comprising depositing the at least one metal layer on a Bragg stack deposited on a substrate so that the metal layer has a full-width half maximum rocking curve of less than about 4.5 degrees and depositing the piezoelectric material on the metal layer, whereby the texture of the piezoelectric material has a full-width half maximum rocking curve of less than about 3.5 degrees.

2. A method for fabrication a resonator device comprising the steps of:

depositing a Bragg stack on a substrate;

polishing the upper surface of the Bragg stack;

depositing a textured metal layer on the Bragg stack whereby the metal layer has a surface roughness of less than about 15 Å;

patterning the textured metal layer to defined a first electrode;

depositing a piezoelectric material on the electrode by sputtering whereby the texture of the piezoelectric material is determined by the full-width half maximum rocking curve of the textured metal layer without lattice matching.

depositing a metal on the piezoelectric material to defined a second electrode.

3. The method of claim 2 in which the low surface roughness of the metal layer is achieved with the full width half maximum rocking curve of the metal layer being in the range of about 0.2 to 11°.

4. The method of claim 2 in which the upper surface of the Bragg stack is polished so that it has a root-mean-square surface roughness of less than about 3 Å.

* * * * *